(12) United States Patent
Chen et al.

(10) Patent No.: US 9,024,445 B2
(45) Date of Patent: May 5, 2015

(54) SEMICONDUCTOR DEVICE HAVING CONDUCTIVE VIAS AND SEMICONDUCTOR PACKAGE HAVING SEMICONDUCTOR DEVICE

(75) Inventors: Kuo Hua Chen, Kaohsiung (TW); Li Wen Tsai, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 1014 days.

(21) Appl. No.: 13/113,961

(22) Filed: May 23, 2011

(65) Prior Publication Data

US 2012/0126420 A1 May 24, 2012

(30) Foreign Application Priority Data

Nov. 19, 2010 (TW) .................... 99140103 A

(51) Int. Cl.
*H01L 23/48* (2006.01)
*H01L 21/28* (2006.01)
*H01L 23/00* (2006.01)

(52) U.S. Cl.
CPC .............. *H01L 24/03* (2013.01); *H01L 23/481* (2013.01); *H01L 24/05* (2013.01); *H01L 24/06* (2013.01); *H01L 24/16* (2013.01); *H01L 2224/05552* (2013.01); *H01L 2224/05558* (2013.01); *H01L 2224/056* (2013.01); *H01L 2224/0603* (2013.01); *H01L 2224/06051* (2013.01); *H01L 2924/01013* (2013.01); *H01L 2924/01029* (2013.01); *H01L 2924/014* (2013.01); *H01L 2224/131* (2013.01); *H01L 2924/01033* (2013.01); *H01L 2924/01075* (2013.01)

(58) Field of Classification Search
CPC ............. H01L 2224/05552; H01L 2224/0603; H01L 2224/06051; H01L 24/05; H01L 24/06; H01L 24/16

See application file for complete search history.

(56) References Cited

U.S. PATENT DOCUMENTS

| | | | |
|---|---|---|---|
| 3,761,782 A | 9/1973 | Youmans |
| 4,394,712 A | 7/1983 | Anthony |
| 4,499,655 A | 2/1985 | Anthony |
| 4,807,021 A | 2/1989 | Okumura |
| 4,842,699 A | 6/1989 | Hua et al. |
| 4,897,708 A | 1/1990 | Clements |
| 4,982,265 A | 1/1991 | Watanabe et al. |
| 5,166,097 A | 11/1992 | Tanielian |
| 5,191,405 A | 3/1993 | Tomita et al. |
| 5,229,647 A | 7/1993 | Gnadinger |

(Continued)

FOREIGN PATENT DOCUMENTS

| | | |
|---|---|---|
| JP | 2002246540 A | 8/2002 |
| JP | 2004228135 A | 8/2004 |
| TW | 200612539 A | 4/2006 |

*Primary Examiner* — Michael Lebentritt
*Assistant Examiner* — Jordan Klein
(74) *Attorney, Agent, or Firm* — Morgan Law Offices, PLC

(57) ABSTRACT

The present invention relates to a package having a semiconductor device. The semiconductor device includes a substrate body, a plurality of conductive vias and a plurality of metal pads. The conductive vias are disposed in the through holes of the substrate body. The metal pads are electrically connected to the conductive vias. At least one of the metal pads has at least one curved side wall and at least one reference side wall. The curvature of the curved side wall is different from that of the reference side wall, so as to allow the metal pads to be closer to each other. This arrangement allows the conductive to be closer to each other. Therefore, more conductive vias can be arranged in a limited space.

18 Claims, 12 Drawing Sheets

(56) References Cited

U.S. PATENT DOCUMENTS

| | | |
|---|---|---|
| 5,239,448 A | 8/1993 | Perkins et al. |
| 5,300,815 A * | 4/1994 | Rostoker ............... 257/786 |
| 5,308,443 A | 5/1994 | Sugihara |
| 5,404,044 A | 4/1995 | Booth et al. |
| 5,404,047 A * | 4/1995 | Rostoker et al. ........... 257/786 |
| 5,615,477 A | 4/1997 | Sweitzer |
| 5,643,831 A | 7/1997 | Ochiai et al. |
| 5,925,935 A * | 7/1999 | Kim ....................... 257/786 |
| 5,998,292 A | 12/1999 | Black et al. |
| 6,276,599 B1 | 8/2001 | Ogawa |
| 6,329,631 B1 | 12/2001 | Yueh |
| 6,406,934 B1 | 6/2002 | Glenn et al. |
| 6,448,506 B1 | 9/2002 | Glenn et al. |
| 6,457,633 B1 | 10/2002 | Takashima et al. |
| 6,577,013 B1 | 6/2003 | Glenn et al. |
| 6,670,269 B2 | 12/2003 | Mashino |
| 6,699,787 B2 | 3/2004 | Mashino |
| 6,740,950 B2 | 5/2004 | Paek |
| 6,812,549 B2 | 11/2004 | Umetsu et al. |
| 6,815,348 B2 | 11/2004 | Mashino |
| 6,962,829 B2 | 11/2005 | Glenn et al. |
| 7,078,269 B2 | 7/2006 | Yamasaki et al. |
| 7,134,198 B2 | 11/2006 | Nakatani |
| 7,157,372 B1 * | 1/2007 | Trezza ...................... 438/675 |
| 7,215,032 B2 | 5/2007 | Trezza |
| 7,222,420 B2 * | 5/2007 | Moriizumi ................. 29/830 |
| 7,238,590 B2 | 7/2007 | Yang et al. |
| 7,262,475 B2 | 8/2007 | Kwon et al. |
| 7,276,787 B2 * | 10/2007 | Edelstein et al. ........... 257/698 |
| 7,285,434 B2 | 10/2007 | Yee et al. |
| 7,298,030 B2 | 11/2007 | McWilliams et al. |
| 7,334,326 B1 | 2/2008 | Huemoeller et al. |
| 7,365,436 B2 | 4/2008 | Yamano |
| 7,371,602 B2 | 5/2008 | Yee |
| 7,388,293 B2 | 6/2008 | Fukase et al. |
| 7,415,762 B2 | 8/2008 | Fukase et al. |
| 7,482,272 B2 | 1/2009 | Trezza |
| 7,508,057 B2 | 3/2009 | Shiraishi et al. |
| 7,508,079 B2 | 3/2009 | Higashi |
| 7,528,053 B2 | 5/2009 | Huang et al. |
| 7,538,033 B2 | 5/2009 | Trezza |
| 7,553,752 B2 | 6/2009 | Kuan et al. |
| 7,560,744 B2 | 7/2009 | Hsiao et al. |
| 7,598,163 B2 | 10/2009 | Callahan et al. |
| 7,605,463 B2 | 10/2009 | Sunohara |
| 7,625,818 B2 | 12/2009 | Wang |
| 7,642,132 B2 | 1/2010 | Huang et al. |
| 7,656,023 B2 | 2/2010 | Sunohara et al. |
| 7,659,202 B2 | 2/2010 | Trezza |
| 7,666,711 B2 | 2/2010 | Pagaila et al. |
| 7,678,685 B2 | 3/2010 | Sunohara et al. |
| 7,681,779 B2 | 3/2010 | Yang |
| 7,687,397 B2 | 3/2010 | Trezza |
| 7,691,747 B2 | 4/2010 | Lin et al. |
| 7,733,661 B2 | 6/2010 | Kossives et al. |
| 7,741,148 B1 | 6/2010 | Marimuthu et al. |
| 7,741,152 B2 | 6/2010 | Huang et al. |
| 7,741,156 B2 | 6/2010 | Pagaila et al. |
| 7,772,081 B2 | 8/2010 | Lin et al. |
| 7,772,118 B2 | 8/2010 | Yamano |
| 7,786,008 B2 | 8/2010 | Do et al. |
| 7,786,592 B2 | 8/2010 | Trezza |
| 7,795,140 B2 | 9/2010 | Taguchi et al. |
| 7,808,060 B2 | 10/2010 | Hsiao |
| 7,808,110 B2 * | 10/2010 | Wang et al. .................. 257/773 |
| 7,808,111 B2 | 10/2010 | Trezza |
| 7,811,858 B2 | 10/2010 | Wang et al. |
| 7,816,265 B2 | 10/2010 | Wang |
| 7,842,597 B2 | 11/2010 | Tsai |
| 2001/0011605 A1 * | 8/2001 | Distefano et al. ............. 174/255 |
| 2002/0017855 A1 | 2/2002 | Cooper et al. |
| 2002/0094605 A1 | 7/2002 | Pai et al. |
| 2004/0124518 A1 | 7/2004 | Karnezos |
| 2004/0259292 A1 | 12/2004 | Beyne et al. |
| 2005/0136641 A1 * | 6/2005 | Rinne ......................... 438/612 |
| 2005/0189635 A1 | 9/2005 | Humpston et al. |
| 2005/0258545 A1 | 11/2005 | Kwon |
| 2006/0027632 A1 | 2/2006 | Akram |
| 2006/0076679 A1 * | 4/2006 | Batchelor et al. ............. 257/737 |
| 2006/0138675 A1 * | 6/2006 | Rinne ......................... 257/779 |
| 2006/0197216 A1 | 9/2006 | Yee |
| 2007/0048896 A1 | 3/2007 | Andry et al. |
| 2007/0138562 A1 | 6/2007 | Trezza |
| 2007/0187711 A1 | 8/2007 | Hsiao et al. |
| 2008/0272486 A1 | 11/2008 | Wang et al. |
| 2009/0032928 A1 | 2/2009 | Chiang et al. |
| 2009/0039527 A1 | 2/2009 | Chan et al. |
| 2009/0140436 A1 * | 6/2009 | Wang ........................ 257/774 |
| 2009/0146297 A1 | 6/2009 | Badakere et al. |
| 2009/0166785 A1 | 7/2009 | Camacho et al. |
| 2009/0243045 A1 | 10/2009 | Pagaila et al. |
| 2009/0294959 A1 | 12/2009 | Chiang et al. |
| 2009/0302435 A1 | 12/2009 | Pagaila et al. |
| 2009/0302437 A1 | 12/2009 | Kim et al. |
| 2009/0309235 A1 | 12/2009 | Suthiwongsunthorn et al. |
| 2009/0321916 A1 | 12/2009 | Wang et al. |
| 2010/0059855 A1 | 3/2010 | Lin et al. |
| 2010/0065948 A1 | 3/2010 | Bae et al. |
| 2010/0133704 A1 | 6/2010 | Marimuthu et al. |
| 2010/0140737 A1 | 6/2010 | Lin et al. |
| 2010/0140751 A1 | 6/2010 | Tay et al. |
| 2010/0140752 A1 | 6/2010 | Marimuthu et al. |
| 2010/0140776 A1 | 6/2010 | Trezza |
| 2010/0148316 A1 | 6/2010 | Kim et al. |
| 2010/0187681 A1 | 7/2010 | Chen et al. |
| 2010/0197134 A1 | 8/2010 | Trezza |
| 2010/0230759 A1 | 9/2010 | Yang et al. |
| 2010/0230760 A1 | 9/2010 | Hung |
| 2010/0230788 A1 | 9/2010 | Peng |
| 2010/0244244 A1 | 9/2010 | Yang |
| 2010/0276690 A1 | 11/2010 | Chen |
| 2010/0327465 A1 | 12/2010 | Shen et al. |
| 2011/0048788 A1 | 3/2011 | Wang et al. |
| 2011/0068437 A1 | 3/2011 | Chiu et al. |

\* cited by examiner

SEMICONDUCTOR DEVICE HAVING CONDUCTIVE VIAS AND SEMICONDUCTOR PACKAGE HAVING SEMICONDUCTOR DEVICE

CROSS-REFERENCE TO RELATED APPLICATIONS

This application claims the benefit of Taiwan application Serial No. 099140103, filed Nov. 19, 2010, the subject matter of which is incorporated herein by reference.

BACKGROUND OF THE INVENTION

1. Field of the Invention

The present invention relates to the field of semiconductor packaging, and, more particularly, to semiconductor packaging employing through silicon via (TSV) technology.

2. Description of the Related Art

In recent years, use of through silicon via (TSV) has become an increasingly popular technique in the field of 3-D semiconductor packaging. In TSV, chips can be stacked on top of one another, and connected using conductive vias which are vertical pathways of interconnects that run through the chips.

Conventionally, a silicon substrate will include a plurality of through holes in which the conductive vias are formed. Attached to each of the conductive vias is a metal pad. From a top view, the metal pads are circular and wider than that of the conductive vias. However, the width of the metal pads limits how close the conductive vias can be to one another.

SUMMARY OF THE INVENTION

One aspect of the disclosure relates to a semiconductor substrate. In one embodiment, the substrate includes a plurality of conductive vias, each of the conductive vias disposed in an insulated through hole and having a metal pad electrically connected thereto, wherein a first conductive via includes a first metal pad having a curved side wall and a reference side wall, the curvature of the curved side wall different from that of the reference side wall.

Another aspect of the disclosure relates to a semiconductor package. In one embodiment, the semiconductor package includes: (1) a substrate comprising a plurality of conductive vias, each of the conductive vias disposed in an insulated through hole and having a metal pad electrically connected thereto, wherein a first conductive via includes a first metal pad, the first metal pad, when viewed with respect to the top of the substrate, appears substantially as a truncated circle, such shape allowing the first conductive via to be placed closer to, and without electrically contacting, an adjacent, second conductive via; and a passivation layer, disposed adjacent to the substrate, and having openings to expose the conductive vias; (2) a chip, coupled to the semiconductor device, the chip having a plurality of conductive elements to electrically connect the metal pads; and (3) an underfill, disposed between the chip and the semiconductor device so as to cover the conductive elements.

Another aspect of the disclosure relates to manufacturing methods. In one embodiment, a manufacturing method includes: (1) providing a semiconductor wafer, the semiconductor wafer having a first surface, a second surface, and a plurality of holes penetrating the first surface; (2) placing a conductive material in each of the holes, the conductive material insulated from the semiconductor wafer; (3) thinning the semiconductor wafer to expose the holes on the second surface, the holes becoming through holes and the conductive material becoming conductive vias; (4) forming a passivation layer on the second surface, the passivation layer including openings to expose the conductive vias; and (5) forming metal pads on each of conductive vias, wherein a first conductive via includes a metal pad having a curved side wall and a reference side wall, wherein the curvature of the curved side wall is different from that of the reference side wall Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
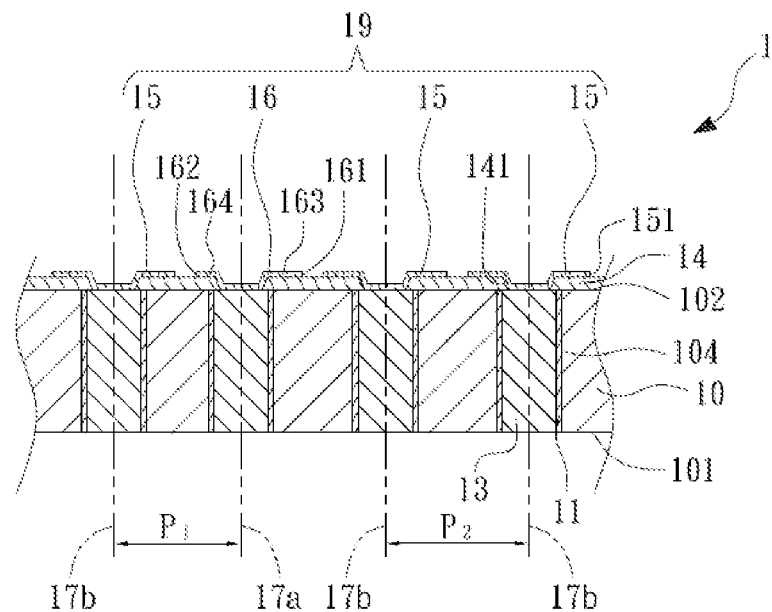
FIG. 1 shows a cross-sectional view of a semiconductor device according to an embodiment of the present invention.
Figure 2:
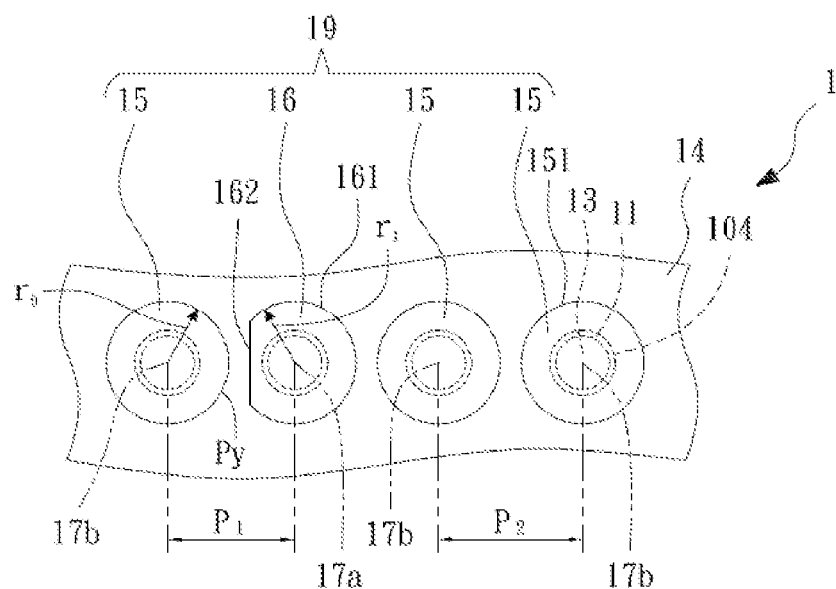
FIG. 2 shows a top view of FIG. 1.

Referring to FIGS. 1 and 2, a cross-sectional view and a top view of a semiconductor device 1 according to an embodiment of the present invention are illustrated, respectively. The semiconductor device 1 comprises a substrate 10, a plurality of conductive vias 13, an insulation material 11, a first passivation layer 14 and a plurality of metal pads 19.

The substrate 10 has a first surface 101, a second surface 102 and a plurality of through holes 104. In this embodiment, the substrate 10 is a silicon substrate, and the through holes 104 penetrate through the substrate 10. Each of the conductive vias 13 is disposed in one of the through holes 104. In this embodiment, the conductive vias 13 are solid cylinders, i.e. the through holes 104 or cylinders are completely filled with conductive material.

The insulation material 11 is disposed between each of the conductive vias 13 and a side wall of the respective through hole 104. The first passivation layer 14 is disposed adjacent to the second surface 102, and has at least one opening 141 to expose the conductive vias 13. The metal pads 19 are disposed in the at least one opening 141 and electrically connected to the conductive vias 13.

Referring to FIG. 2, the metal pads 19 comprise a first metal pad 16 and a plurality of original metal pads 15. The outer side walls of the original metal pads 15 are circular side walls 151. The first metal pad 16 has at least one first curved side wall 161 and at least one first reference side wall 162, and the curvature of the first curved side wall 161 is different from that of the first reference side wall 162. Therefore, from the top view, each of the original metal pads 15 is a substantially complete circle, but the first metal pad 16 is not a complete circle. Preferably, the curvature of the first reference side wall 162 is less than that of the first curved side wall 161. In the embodiment, the first reference side wall 162 is a flat plane whose curvature is zero. Alternatively, the first reference side wall 162 may be curved, but its curvature is still less than that of the first curved side wall 161. Therefore, the surface area of the first metal pad 16 is less than the surface area of the original metal pads 15. Preferably, the surface area of the first metal pad 16 is about 50%~70% of that of the original metal pads 15, most preferably, about 65%~70% of that of the original metal pads 15.

Referring to FIG. 1, the first metal pad 16 has a first extension portion 163 and a second extension portion 164. The first extension portion 163 extends to the first curved side wall 161. The second extension portion 164 extends to the first reference side wall 162. The length of the second extension portion 164 is less than that of the first extension portion 163.

The conductive via 13 below the first metal pad 16 has a central axis 17a, and the conductive via 13 below the original metal pad 15 has a central axis 17b. The distance between the central axis 17a and the central axis 17b is defined as a first pitch $P_1$, and the distance between two central axes 17b is defined as a second pitch $P_2$. The first pitch $P_1$ is less than the second pitch $P_2$ because the first metal pad 16 has the first reference side wall 162 and the curvature of the first reference side wall 162 is less than that of the first curved side wall 161. Therefore, the conductive vias 13 can be closer.

In this embodiment, the curved side wall 151 defines an original radius $r_0$ and the first curved side wall 161 defines a first radius $r_1$. The first pitch $P_1$ is equal to or less than the sum of the original radius $r_0$ and the first radius $r_1$. That is, $P_1 \leq r_0 + r_1$.

Furthermore, the first radius $r_1$ is greater than the distance from the central axis 17a and periphery Py of the original metal pad 15, so as to allow the first metal pad 16 to be placed closer to the original metal pad 15. (In this case, the periphery Py of the second metal pad 16b includes the points along the perimeter of the original metal pad 15).

Figure 3:
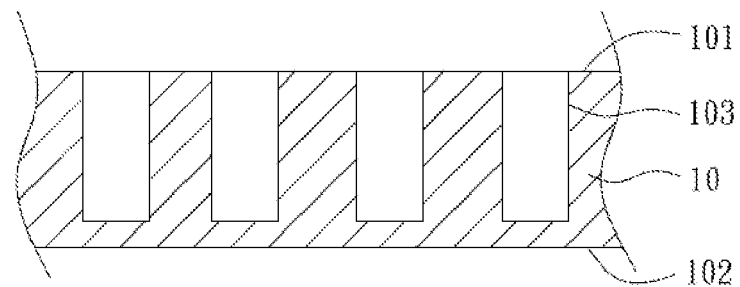
FIGS. 3 to 7 show cross-sectional views of a method for making a semiconductor device according to an embodiment of the present invention.

Referring to FIGS. 3 to 7, the cross-sectional views of a method for making a semiconductor device according to an embodiment of the present invention are illustrated. Referring to FIG. 3, a substrate body 10 is provided. The substrate body 10, for example, a wafer, has a first surface 101, a second surface 102 and a plurality of holes 103. In this embodiment, the substrate body 10 is made from semiconductor material, such as silicon, germanium, etc. and the holes 103 are blind holes and open at the first surface 101. In this embodiment, the substrate body 10 can be a functional die, such as a processor or a memory die, or an interposer. In other embodiments, the substrate body 10 can be made from conductive material, such as copper, aluminum, etc.

In other embodiments, the holes 103 can be through holes that penetrate through the substrate body 10. The holes 103 in the substrate body 10 are made by different ways, such as laser drill, plasma etching through a mask or chemical etching.

Figure 4:
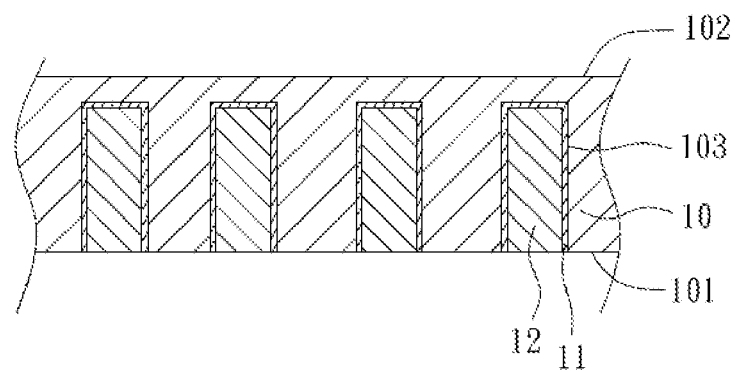

Referring to FIG. 4, an insulation material 11, i.e., the non-conductive polymer such as polyimide (PI), epoxy or benzocyclobutene (BCB), and a conductive material 12, i.e., copper are formed inside the holes 103. The insulation material 11 is formed between the substrate body 10 and the conductive material 12. In this embodiment, the insulation material 11 can be applied by a laminating process or a spin coating process; the conductive material 12 is formed by electroplating.

Figure 5:
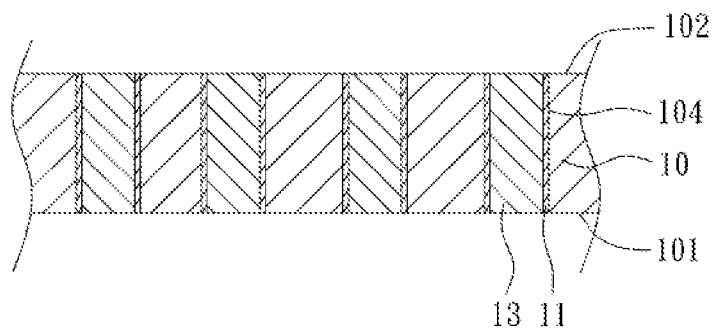

Referring to FIG. 5, the substrate body 10 is thinned by removing part of the second surface 102 by grinding and/or etching, so that the holes 103 become a plurality of through holes 104 and the conductive material 12 is exposed and becomes a plurality of conductive vias 13.

Figure 6:
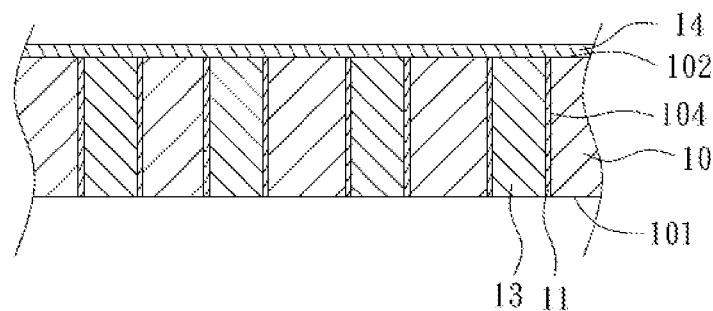

Referring to FIG. 6, a first passivation layer 14 is formed on the second surface 102 by a laminating process or a spin coating process. The first passivation layer 14 may be a non-conductive polymer such as polyimide, epoxy or benzocyclobutene. In the embodiment, the first passivation layer 14 is a photo sensitive polymer such as benzocyclobutene, and is formed by spin coating or spray coating.

Figure 7:
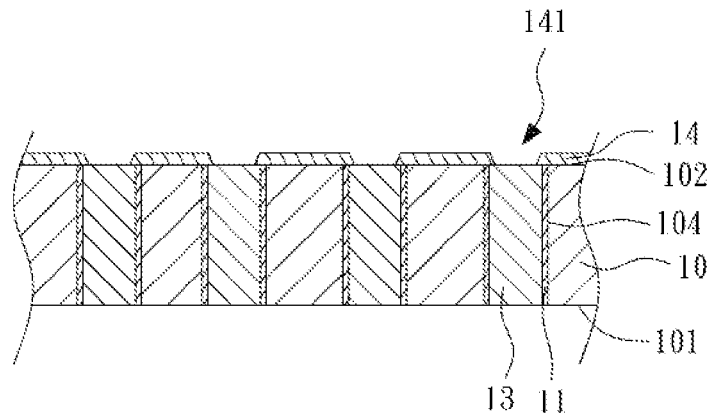

Referring to FIG. 7, a photolithography is proceeded to form at least one opening 141 and the conductive vias 13 are exposed. The size and position of the opening is defined by the mask used in the photolithography.

Referring to FIG. 1 again, a metal layer is formed on the first passivation layer 14 and in the opening 141 by an electroplating process to contact the conductive vias 13. An etching process is used to form a plurality of metal pads 19. Meanwhile, the semiconductor device 1 according to an embodiment of the present invention is manufactured. The metal pads 19 do not connect to each other, and the sizes and positions of the metal pads 19 are defined by the mask used in the etching process. Preferably, from a top view, the area of each of the metal pads 19 is larger than that of each of the conductive vias 13.

Referring to FIG. 2 again, the metal pads 19 comprise a first metal pad 16 and a plurality of original metal pads 15. The outer side walls of the original metal pads 15 are circular side walls 151. The first metal pad 16 has a first curved side wall 161 and a first reference side wall 162, and the curvature of the first curved side wall 161 is different from that of the first reference side wall 162.

Figure 8:
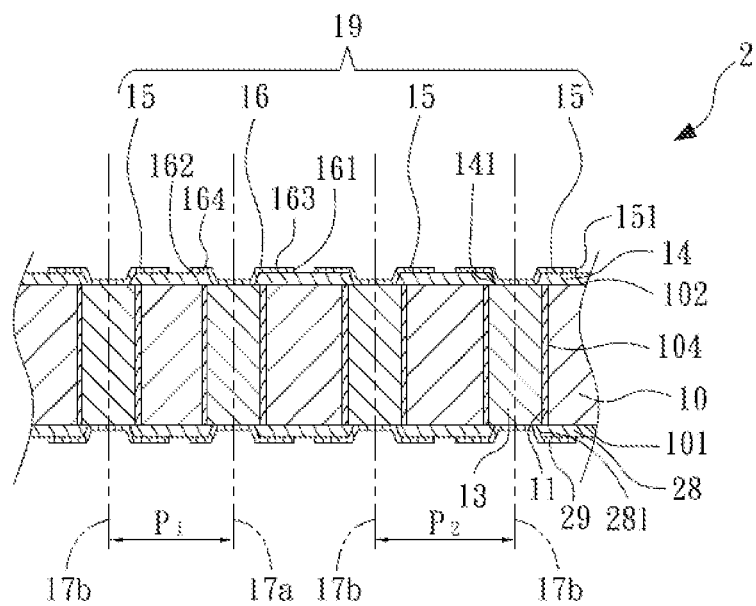
FIG. 8 shows a cross-sectional view of a semiconductor device according to another embodiment of the present invention.

Referring to FIG. 8, a cross-sectional view of a semiconductor device according to another embodiment of the present invention is illustrated. The semiconductor device 2 of this embodiment is substantially the same as the semiconductor device 1 (FIG. 1), and the same elements are designated with the same reference numerals. The difference between the semiconductor device 2 and the semiconductor device 1 is that the semiconductor device 2 further comprises a second passivation layer 28. The material of the second passivation layer 28 is a non-conductive polymer and may be the same as that of the first passivation layer 14. The second passivation layer 28 is disposed adjacent to the first surface 101, and has at least one opening 281 to expose the conductive vias 13. In this embodiment, some of the metal pads 19 (for example, the metal pads 29) are disposed in the opening 281 of the second passivation layer 28 and electrically connected to the conductive vias 13. The structure of the metal pads 29 that are disposed adjacent to the first surface 101 is symmetrical with and same as that of the metal pads 19 that are disposed adjacent to the second surface 102.

In other embodiments, the structure of the metal pads 29 that are disposed adjacent to the first surface 101 may be asymmetrical with that of the metal pads 19 that are disposed adjacent to the second surface 102.

Figure 9:
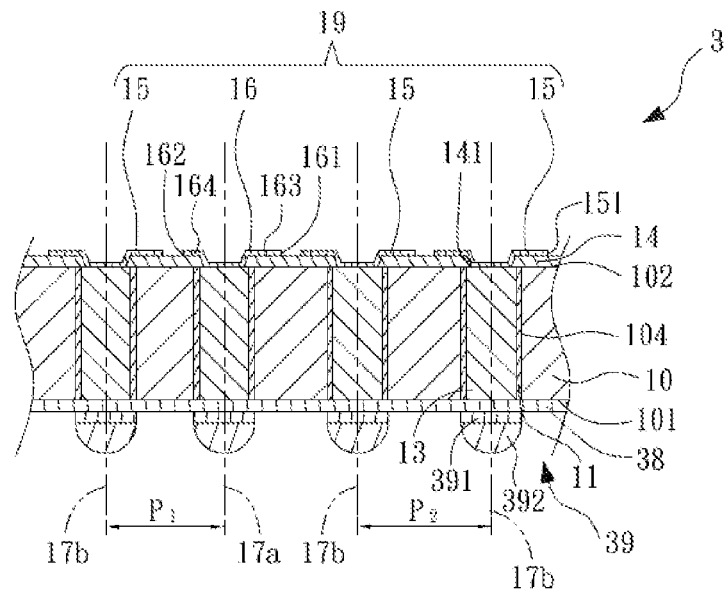
FIG. 9 shows a cross-sectional view of a semiconductor device according to another embodiment of the present invention.

Referring to FIG. 9, a cross-sectional view of a semiconductor device according to another embodiment of the present invention is illustrated. The semiconductor device 3 of this embodiment is substantially the same as the semiconductor device 1 (FIG. 1), and the same elements are designated with the same reference numerals. The difference between the semiconductor device 3 and the semiconductor device 1 is that the semiconductor device 3 further comprises a circuit layer 38 and a plurality of connection elements 39. The circuit layer 38 is disposed on the first surface 101 of the substrate body 10, and electrically connected to the conductive vias 13. The connection elements 39 are disposed on the circuit layer 38. In this embodiment, each of the connection elements 39 includes a pad 391 and a bump 392. It is to be noted that the circuit layer 38 may include a redistribution layer (not shown) which is used to redistribute the positions of the connection elements 39.

Figure 10:
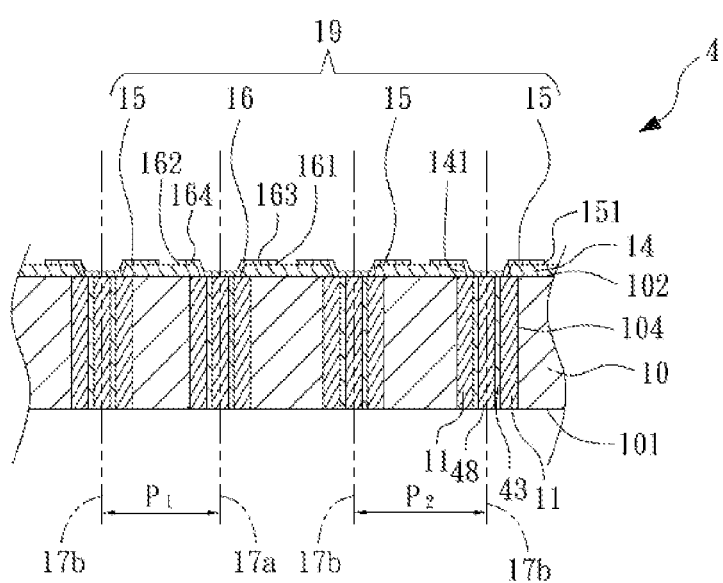
FIG. 10 shows a cross-sectional view of a semiconductor device according to another embodiment of the present invention.
Figure 11:
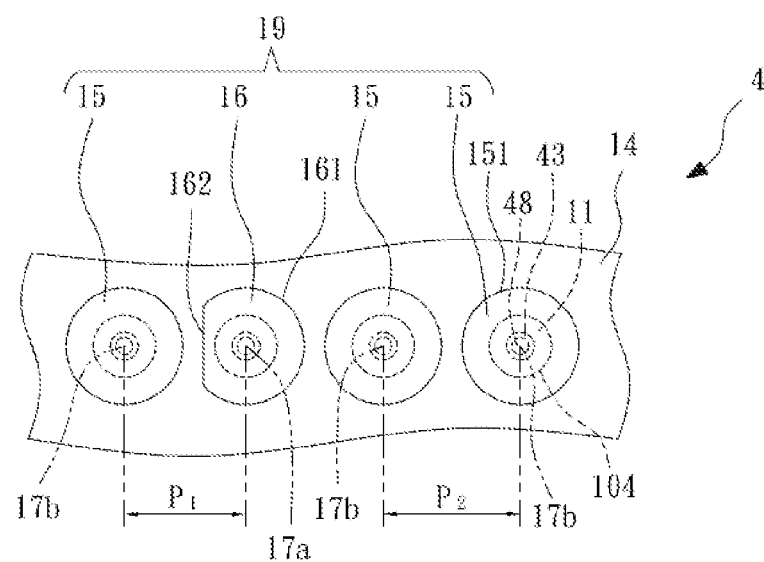
FIG. 11 shows a top view of FIG. 10.

Referring to FIGS. 10 and 11, a cross-sectional view and a top view of a semiconductor device according to another embodiment of the present invention are illustrated, respectively. The semiconductor device 4 of this embodiment is substantially the same as the semiconductor device 1 (FIG. 1), and the same elements are designated with the same reference numerals.

Figure 12:
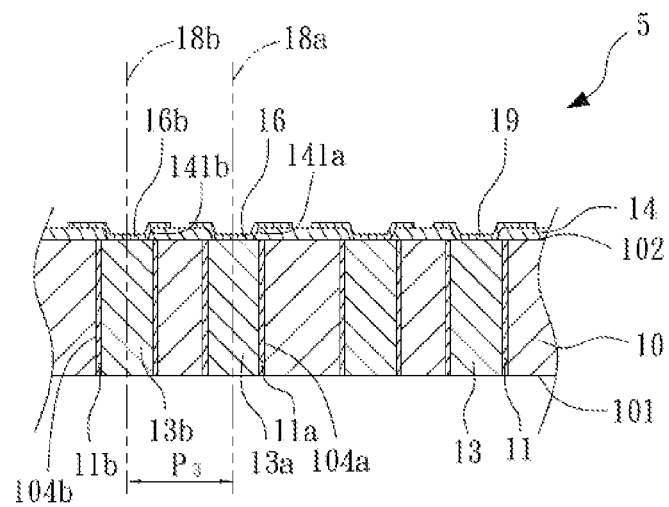
FIG. 12 shows a cross-sectional view of a semiconductor device according to another embodiment of the present invention.
Figure 13:
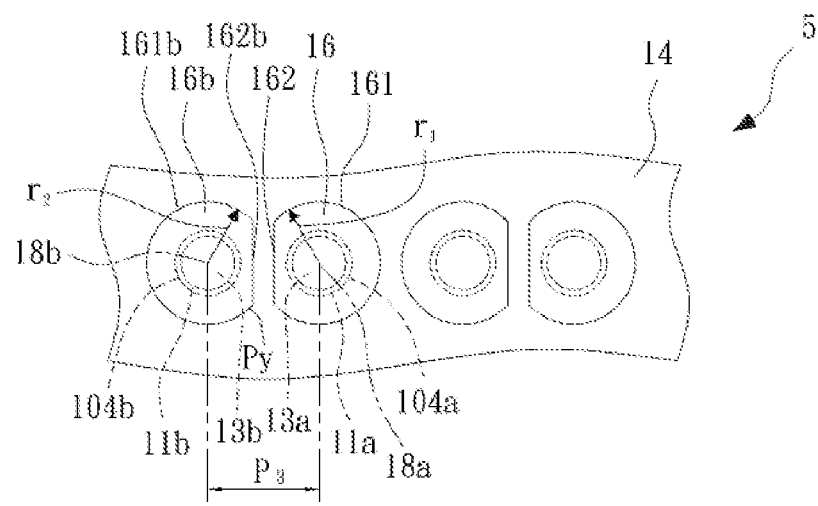
FIG. 13 shows a top view of FIG. 12.

The difference between the semiconductor device 4 and the semiconductor device 1 is that the conductive vias 43 are hollow cylinders, i.e., each of the conductive vias 43 is an annular segment. The conductive vias 43 are coupled to an outer non-conductive annular material 11. Further, an inner non-conductive material 48 is disposed inside the cylinder formed by the conductive vias 43. Thus, the semiconductor device 4 embodies a tri-axial structure formed by outer non-conductive annular segments 11, conductive annular vias 43, and inner non conductive segments 48. Referring to FIGS. 12 and 13, a cross-sectional view and a top view of a semiconductor device according to another embodiment of the present invention are illustrated, respectively. The semiconductor device 5 comprises a substrate body 10, a plurality of conductive vias 13, an insulation material 11, a first passivation layer 14 and a plurality of metal pads 19.

The substrate body 10 has a first through hole 104a and a second through hole 104b. The conductive vias 13 comprises a first conductive via 13a and a second conductive via 13b. The first conductive via 13a is disposed in the first through hole 104a, and the second conductive via 13b is disposed in the second through hole 104b. The insulation material 11 comprises a first insulation material 11a and a second insulation material 11b. The first insulation material 11a is disposed between the first conductive via 13a and a side wall of the first through hole 104a, and the second insulation material 11b is disposed between the second conductive via 13b and a side wall of the second through hole 104b. The first passivation layer 14 has a first opening 141a and a second opening 141b. The first opening 141a exposes the first conductive via 13a, and the second opening 141b exposes the second conductive via 13b.

The metal pads 19 comprise a first metal pad 16 and a second metal pad 16b. The first metal pad 16 is disposed in the first opening 141a and electrically connected to the first conductive via 13a. The first metal pad 16 has at least one first curved side wall 161 and at least one first reference side wall 162, and the curvature of the first curved side wall 161 is different from that of the first reference side wall 162. The second metal pad 16b is disposed in the second opening 141b and electrically connected to the second conductive via 13b. The second metal pad 16b has at least one second curved side wall 161b and at least one second reference side wall 162b, and the curvature of the second curved side wall 161b is different from that of the second reference side wall 162b. The first reference side wall 162 faces the second reference side wall 162b. In comparison with the original metal pad 15 (FIG. 2), the surface area of each of the first metal pad 16 and the second metal pad 16b is reduced to 50%~70%. Preferably, the surface area of each of the first metal pad 16 and the second metal pad 16b is reduced to 65%~70%.

The first conductive via 13a has a first central axis 18a, and the second conductive via 13b has a second central axis 18b. The distance between the first central axis 18a and the second central axis 18b is defined as a third pitch $P_3$. The third pitch $P_3$ is less than the first pitch $P_1$ (FIG. 6) and is also less than the second pitch $P_2$ (FIG. 6). Therefore, the first conductive vias 13a and the second conductive via 13b can be closer to each other.

In this embodiment, the first curved side wall 161 defines a first radius r1, and the second curved side wall 161b defines a second radius r2. The third pitch P3 is less than the sum of the first radius r1 and the second radius r2. That is, $P_3 < r_1 + r_2$.

Furthermore, the first radius $r_1$ is greater than the distance from the central axis 18a and any point on the periphery Py of the second metal pad 16b, so as to allow the second metal pad 16b to be placed closer to the first metal pad 16. (In this case, the periphery Py of the second metal pad 16b includes the points on the perimeter of the second metal pad 16b).

Figure 14:
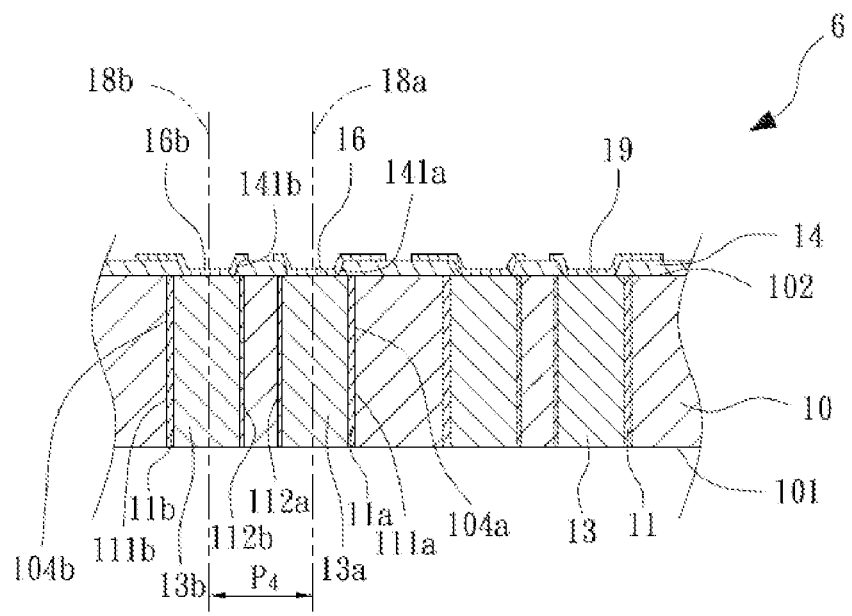
FIG. 14 shows a cross-sectional view of a semiconductor device according to another embodiment of the present invention.
Figure 15:
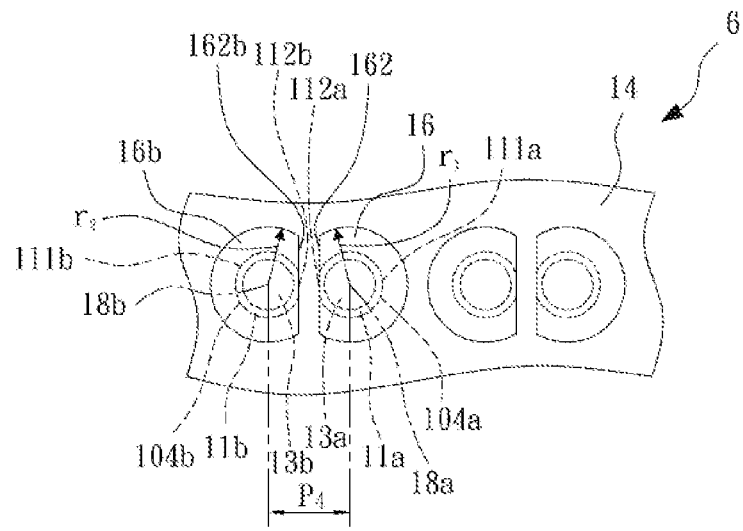
FIG. 15 shows a top view of FIG. 14.

Referring to FIGS. 14 and 15, a cross-sectional view and a top view of a semiconductor device according to another embodiment of the present invention are illustrated, respectively. The semiconductor device 6 of this embodiment is substantially the same as the semiconductor device 5 (FIGS. 12 and 13), and the same elements are designated with the same reference numerals. The difference between the semiconductor device 6 and the semiconductor device 5 is the structures of the first through hole 104a, the second through hole 104b, the first insulation material 11a and the second insulation material 11b and is described as follows. In this embodiment, the first through hole 104a and the second through hole 104b are not cylindrical, and have a curved side wall and a reference side wall. Therefore, the first insulation material 11a has at least one first curved side wall 111a and at least one first reference side wall 112a. The first reference side wall 112a of the first insulation material 11a corresponds to the first reference side wall 162 of the first metal pad 16. The second insulation material 11b has at least one second curved side wall 111b and at least one second reference side wall 112b. The second reference side wall of 112b the second insulation material 11b corresponds to the second reference side wall 162b of the second metal pad 16b.

The distance between the first central axis 18a and the second central axis 18b is defined as a fourth pitch $P_4$. The fourth pitch $P_4$ is less than the third pitch $P_3$ (FIG. 13). Therefore, the first conductive vias 13a and the second conductive via 13b can be closer to each other.

Figure 16:
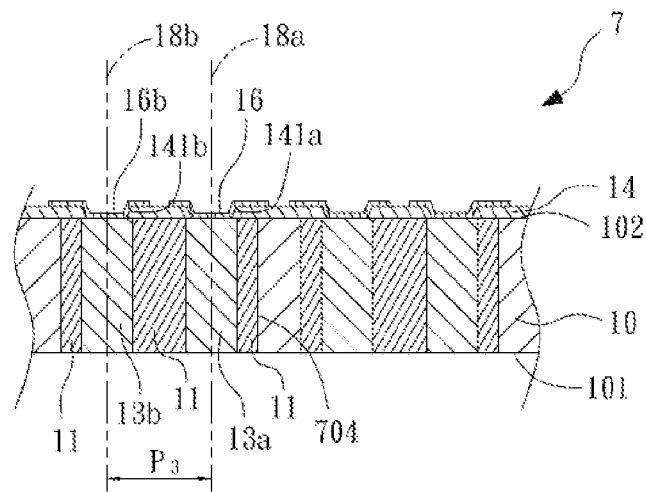
FIG. 16 shows a cross-sectional view of a semiconductor device according to another embodiment of the present invention.
Figure 17:
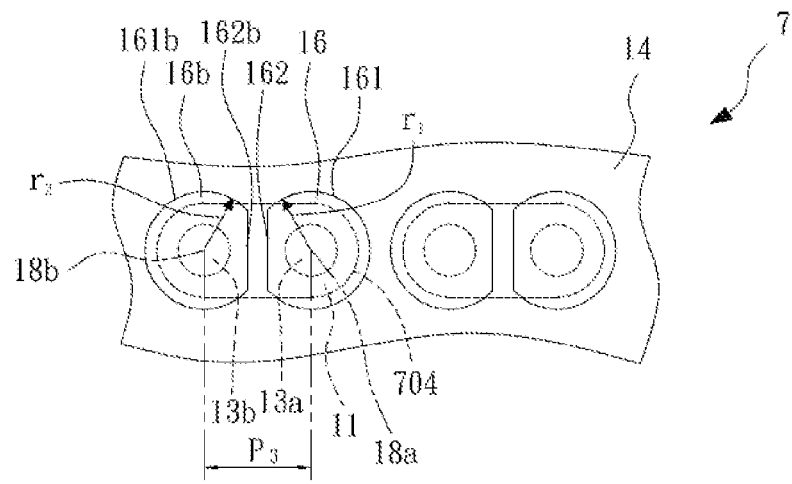
FIG. 17 shows a top view of FIG. 16.

Referring to FIGS. 16 and 17, a cross-sectional view and a top view of a semiconductor device according to another embodiment of the present invention are illustrated, respectively. The semiconductor device 7 of this embodiment is substantially the same as the semiconductor device 5 (FIGS. 12 and 13), and the same elements are designated with the same reference numerals. The difference between the semiconductor device 7 and the semiconductor device 5 is that the first conductive vias 13a and the second conductive via 13b are disposed in one through hole 704.

Figure 18:
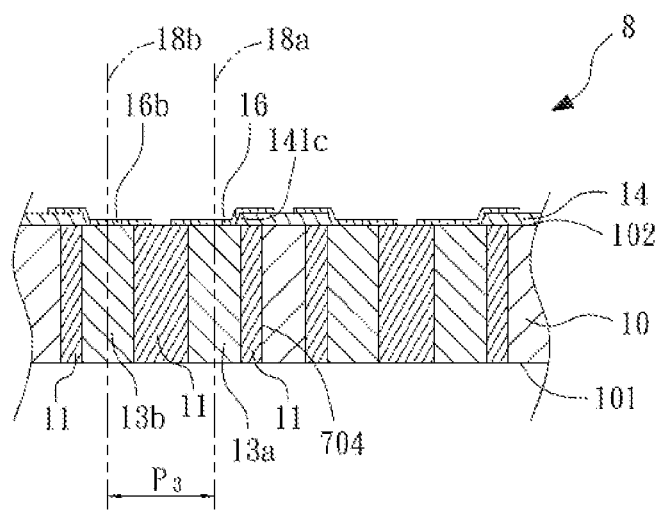
FIG. 18 shows a cross-sectional view of a semiconductor device according to another embodiment of the present invention.
Figure 19:
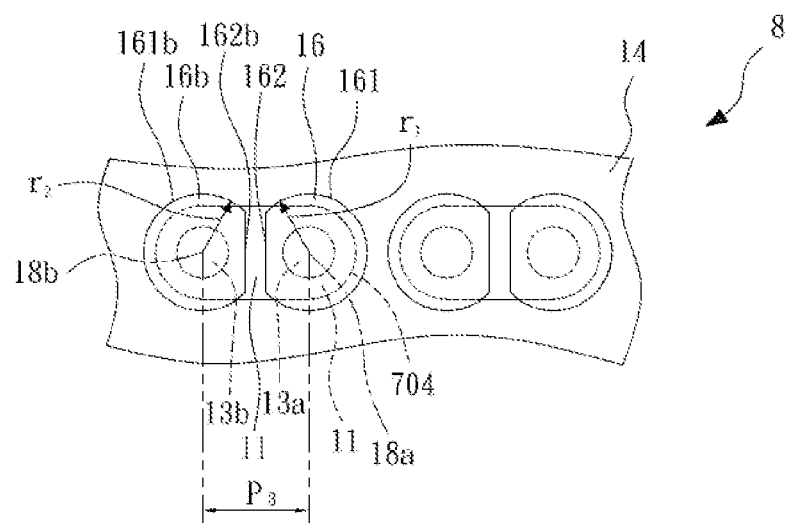
FIG. 19 shows a top view of FIG. 18.

Referring to FIGS. 18 and 19, a cross-sectional view and a top view of a semiconductor device according to another embodiment of the present invention are illustrated, respectively. The semiconductor device 8 of this embodiment is substantially the same as the semiconductor device 7 (FIGS. 16 and 17), and the same elements are designated with the same reference numerals. The difference between the semiconductor device 8 and the semiconductor device 7 is described as follows. In the semiconductor device 7, each of the openings 141a,141b of the first passivation layer 14 exposes each of the conductive vias 13a,13b. However, in this embodiment, the area of the opening 141c of the first passivation layer 14 is larger than the sum of the areas of at least two conductive vias 13a,13b, so as to expose the at least two conductive vias 13a,13b. Preferably, the area of the opening 141c is slightly smaller than that of the through hole 704. Therefore, there is no first passivation layer 14 between the conductive vias 13a,13b.

Figure 20:
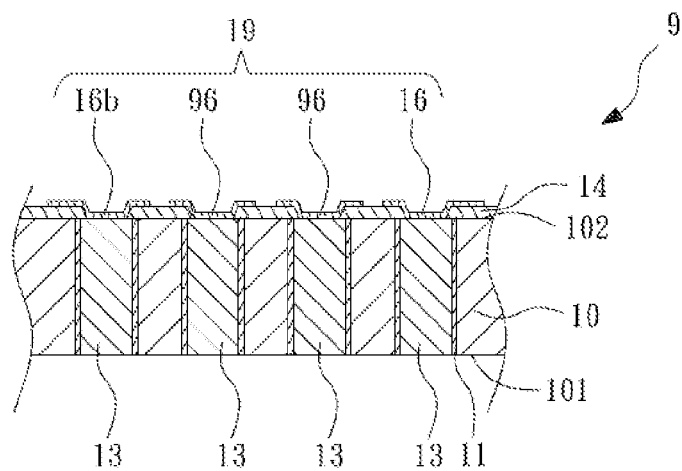
FIG. 20 shows a cross-sectional view of a semiconductor device according to another embodiment of the present invention.
Figure 21:
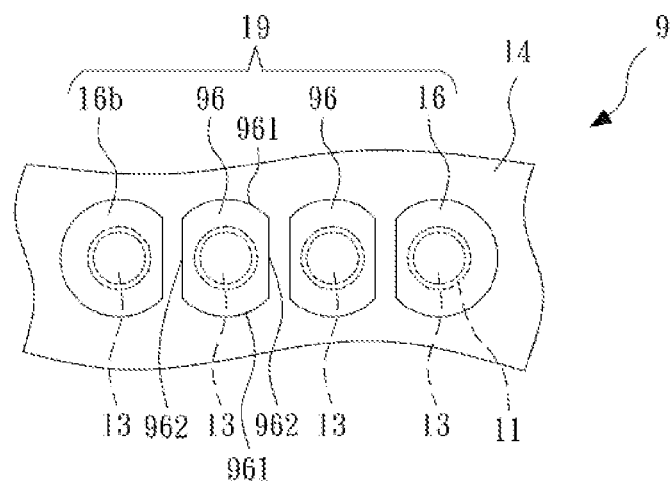
FIG. 21 shows a top view of FIG. 20.

Referring to FIGS. 20 and 21, a cross-sectional view and a top view of a semiconductor device according to another embodiment of the present invention are illustrated, respectively. The semiconductor device 9 of this embodiment is substantially the same as the semiconductor device 1 (FIG. 6), and the same elements are designated with the same reference numerals. The difference between the semiconductor device 9 and the semiconductor device 1 is that some of the metal pads 19 (the metal pads 96) have a plurality of first curved side walls 961 and a plurality of first reference side walls 962. In comparison with the original metal pad 15(FIG. 2), the surface area of the metal pad 961 is reduced to 50%~70%. Preferably, the surface area of the metal pad 961 is reduced to 65%~70%. As a result, the conductive vias 13 can be closer to each other. Therefore, more conductive vias 13 can be arranged in a limited space.

Figure 22:
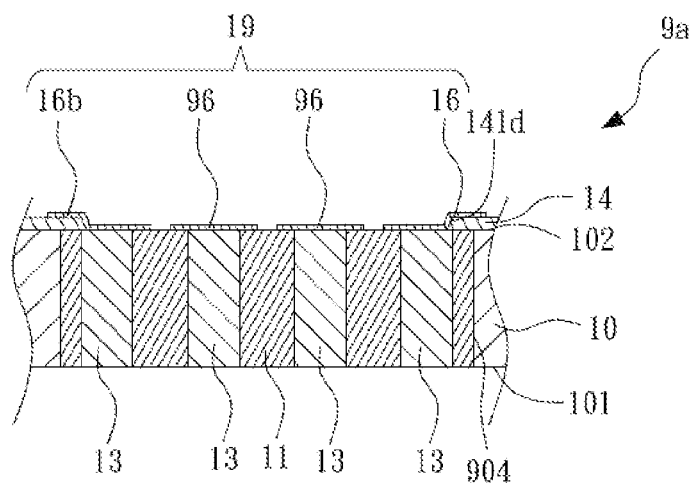
FIG. 22 shows a cross-sectional view of a semiconductor device according to another embodiment of the present invention.
Figure 23:
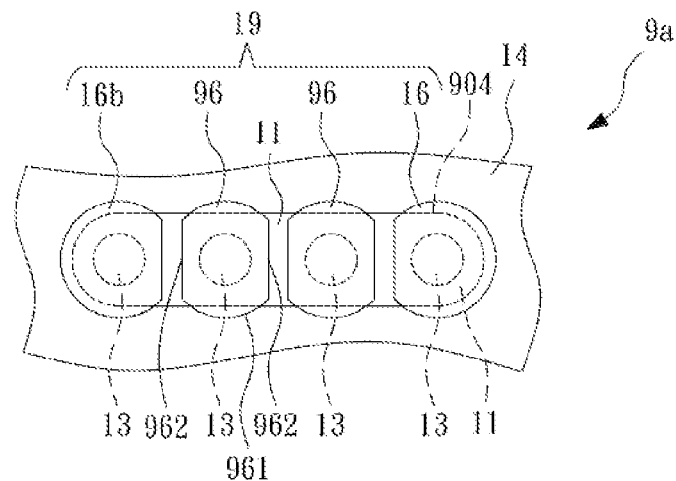
FIG. 23 shows a top view of FIG. 22.

Referring to FIGS. 22 and 23, a cross-sectional view and a top view of a semiconductor device according to another embodiment of the present invention are illustrated, respectively. The semiconductor device 9a of this embodiment is substantially the same as the semiconductor device 9 (FIG. 21), and the same elements are designated with the same reference numerals. The difference between the semiconductor device 9a and the semiconductor device 9 is that the conductive vias 13 are disposed in one through hole 904, and the area of the opening 141d of the first passivation layer 14 is larger than the sum of the areas of the conductive vias 13, so as to expose the conductive vias 13. Therefore, some of the metal pads 19 (the metal pads 96) are disposed on the conductive vias 13 and the insulation material 11, and do not contact the first passivation layer 14.

Figure 24:
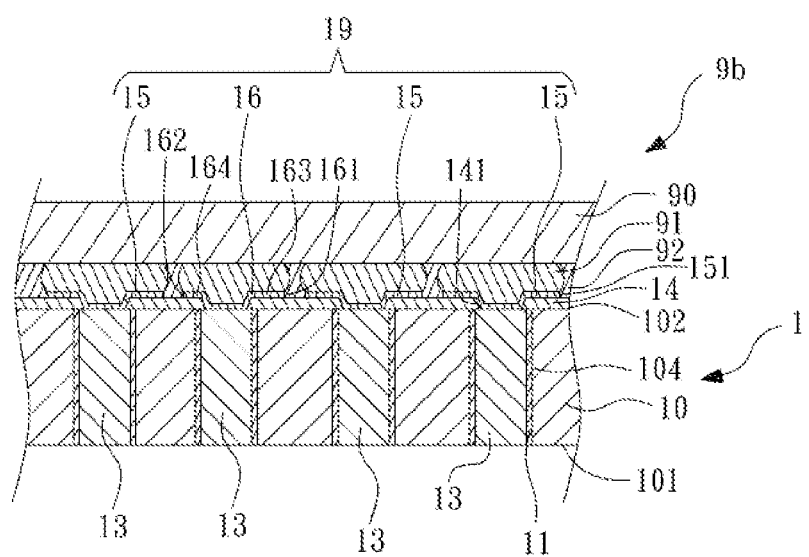
FIG. 24 shows a cross-sectional view of a semiconductor package according to another embodiment of the present invention.

Referring to FIG. 24, a cross-sectional view of a semiconductor package according to another embodiment of the present invention is illustrated. The semiconductor package 9b comprises a semiconductor device 1, a chip 90 and an underfill 92. In this embodiment, the semiconductor device is the semiconductor device 1 as shown in FIG. 6. However, in other embodiment, the semiconductor device 1 may be replaced by the semiconductor devices 2-9a as shown in FIGS. 8-23. The chip 90 is disposed above the semiconductor device 1. The chip 90 has a plurality of conductive elements 91 (i.e., solder balls) to contact and electrically connect the metal pads 19. The underfill 91 is disposed between the chip 90 and the semiconductor device 1 so as to cover and protect the conductive elements 91.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor substrate comprising a plurality of conductive vias, each of the conductive vias disposed in an insulated through hole and having a metal pad electrically connected thereto, wherein a first conductive via includes a first metal pad having a curved side wall and a reference side wall, a curvature of the curved side wall different from that of the reference side wall, and the curved side wall of the first metal pad defines a radius, the radius greater than a distance from a central axis of the first conductive via to a periphery of a second metal pad of an adjacent, second conductive via.

2. The semiconductor substrate of claim 1, wherein the curvature of the reference side wall is substantially zero.

3. The semiconductor substrate of claim 1, wherein the reference side wall faces the second conductive via.

4. The semiconductor substrate of claim 1, wherein a distance between a central axis of the first conductive via and a central axis of an adjacent, second conductive via is defined as a pitch, the curved side wall of the first metal pad defines a first radius, a curved side wall of the metal pad of the second conductive via defines a second radius, and the pitch is equal to or less than the sum of the first radius and the second radius.

5. The semiconductor substrate of claim 1, wherein the first metal pad has a shape of a truncated circle.

6. The semiconductor substrate of claim 1, wherein the first conductive via is disposed in a first through hole, the first through hole including a curved side wall and a reference side wall.

7. The semiconductor substrate of claim 6, wherein the curvature of the curved side wall of the first through hole is different from that of the reference side wall of the first through hole.

8. The semiconductor substrate of claim 6, wherein the curvature of the reference side wall of the first conductive via is substantially zero.

9. The semiconductor substrate of claim 1, wherein the first conductive via and an adjacent, second conductive via are disposed in the same through hole.

10. The semiconductor substrate of claim 1, wherein the first conductive via and at least two other conductive vias are disposed in the same through hole.

11. The semiconductor substrate of claim 1, wherein a second metal pad of an adjacent, second conductive via has a curved side and a reference side wall, and a curvature of the curved side wall is different from that of the reference side wall, and wherein the reference side wall of the first metal pad faces the reference side wall of the second metal pad.

12. A semiconductor package, comprising:
a substrate comprising a plurality of conductive vias, each of the conductive vias disposed in an insulated through hole and having a metal pad electrically connected thereto, wherein a first conductive via includes a first metal pad, the first metal pad, when viewed with respect to the top of the substrate, appears substantially as a truncated circle, such shape allowing the first conductive via to be placed closer to, and without electrically contacting, an adjacent, second conductive via, wherein a curved side wall of the first metal pad defines a radius, the radius greater than a distance from the central axis of the first conductive via to a periphery of the metal pad of the second conductive via;
a passivation layer, disposed adjacent to the substrate and having openings to expose the conductive vias; and
a chip, coupled to the substrate, the chip having a plurality of conductive elements to electrically connect the metal pads.

13. The semiconductor package of claim 12, wherein the first metal pad includes a curved side wall and a reference side wall, wherein a curvature of the curved side wall is different from that of the reference side wall.

14. The semiconductor package of claim 13, wherein the reference side wall faces the second conductive via.

15. The semiconductor package of claim 12, wherein the first conductive via and the second conductive via are disposed in the same through hole.

16. The semiconductor package of claim 12, wherein the first conductive via and the second conductive via are disposed in different through holes.

17. The semiconductor package of claim 12, wherein the metal pad of the second conductive via, when viewed with respect to the top of the substrate, appears substantially as a truncated circle.

18. The semiconductor package of claim 17, wherein the metal pad of the second conductive via includes a curved side wall and a reference side wall, and wherein a curvature of the curved side wall is different from that of the reference side wall.

* * * * *